United States Patent
Song et al.

(10) Patent No.: US 7,372,886 B2
(45) Date of Patent: May 13, 2008

(54) HIGH THERMAL CONDUCTIVITY VERTICAL CAVITY SURFACE EMITTING LASER (VCSEL)

(75) Inventors: Yoon K. Song, Warwick, RI (US); Michael H. Leary, Mountain View, CA (US); Michael R. T. Tan, Menlo Park, CA (US)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 58 days.

(21) Appl. No.: 10/862,753

(22) Filed: Jun. 7, 2004

(65) Prior Publication Data

US 2005/0271113 A1    Dec. 8, 2005

(51) Int. Cl.
*H01S 5/00* (2006.01)
*H01S 3/04* (2006.01)
*H01S 3/08* (2006.01)

(52) U.S. Cl. ............... 372/50.124; 372/34; 372/92; 372/99

(58) Field of Classification Search ............... 372/34, 372/50.124, 92, 99
See application file for complete search history.

(56) References Cited

U.S. PATENT DOCUMENTS

| | | | |
|---|---|---|---|
| 5,557,626 A | 9/1996 | Grodzinski et al. | |
| 5,596,595 A | 1/1997 | Tan et al. | |
| 5,727,014 A | 3/1998 | Wang et al. | |
| 5,729,563 A | 3/1998 | Wang et al. | |
| 5,818,861 A | 10/1998 | Tan et al. | |
| 5,838,708 A | 11/1998 | Lin et al. | |
| 5,838,715 A | 11/1998 | Corzine et al. | |
| 5,867,516 A | 2/1999 | Corzine et al. | |
| 5,892,784 A | 4/1999 | Tan et al. | |
| 5,892,787 A | 4/1999 | Tan et al. | |
| 6,069,908 A | 5/2000 | Yuen et al. | |
| 6,133,589 A | 10/2000 | Krames et al. | |
| 6,188,711 B1 | 2/2001 | Corzine et al. | |
| 6,252,896 B1 | 6/2001 | Tan et al. | |
| 6,570,190 B2 | 5/2003 | Krames et al. | |
| 6,639,931 B1 | 10/2003 | Dowd et al. | |
| 6,647,050 B2 | 11/2003 | Yuen et al. | |
| 6,649,440 B1 | 11/2003 | Krames et al. | |
| 6,650,684 B1 | 11/2003 | Tan et al. | |
| 6,720,585 B1 * | 4/2004 | Wasserbauer et al. | 257/98 |
| 6,810,064 B1 * | 10/2004 | Coldren et al. | 372/96 |

(Continued)

FOREIGN PATENT DOCUMENTS

EP    1246328    10/2002

(Continued)

*Primary Examiner*—Minsun Oh Harvey
*Assistant Examiner*—Phillip Nguyen

(57) ABSTRACT

A light generating device such as a VCSEL includes a light generation layer, a top reflector, a bottom reflector, and a high thermal conductivity (HTC) layer between the light generation layer and the bottom reflector. The light generation layer is adapted to generate light having a first wavelength. Heat produced at the light generation layer is more efficiently dissipated due to the presence of the HTC layer. Alternatively, a light generating device such as a VCSEL includes a light generation layer, a top reflector, and a high thermal conductivity (HTC) bottom reflector. Heat produced at the light generation layer is more efficiently dissipated due to the fact that the bottom reflector is a HTC DBR reflector having lower thermal resistivity than a conventional DBR reflector.

10 Claims, 6 Drawing Sheets

U.S. PATENT DOCUMENTS

| | | |
|---|---|---|
| 6,905,900 B1 * | 6/2005 | Johnson et al. ............... 438/29 |
| 6,959,025 B2 * | 10/2005 | Jikutani et al. .......... 372/46.01 |
| 2002/0101899 A1 | 8/2002 | Yokouchi et al. |
| 2003/0039284 A1 * | 2/2003 | Zheng ......................... 372/45 |
| 2003/0112517 A1 | 6/2003 | Corzine et al. |
| 2003/0123505 A1 | 7/2003 | Peters et al. |
| 2003/0128733 A1 | 7/2003 | Tan et al. |
| 2003/0179801 A1 | 9/2003 | Takeuchi et al. |
| 2003/0181024 A1 | 9/2003 | Takeuchi et al. |
| 2003/0185267 A1 * | 10/2003 | Hwang et al. ................ 372/96 |
| 2004/0066819 A1 | 4/2004 | Johnson |
| 2004/0075908 A1 | 4/2004 | Chen et al. |
| 2004/0161004 A1 * | 8/2004 | Kahen et al. ................. 372/39 |
| 2004/0179568 A1 * | 9/2004 | Amann et al. ................ 372/45 |
| 2004/0208216 A1 * | 10/2004 | Naone et al. ................ 372/45 |
| 2005/0271113 A1 * | 12/2005 | Song et al. ................... 372/98 |

FOREIGN PATENT DOCUMENTS

| | | |
|---|---|---|
| WO | WO-02/17445 | 2/2002 |

\* cited by examiner

Prior Art

HIGH THERMAL CONDUCTIVITY VERTICAL CAVITY SURFACE EMITTING LASER (VCSEL)

BACKGROUND

The present invention relates to lasers, and more particularly, to an improved Vertical Cavity Surface-Emitting Laser.

Light emitting devices, such as lasers, are being increasingly used in a variety of applications such as communications and data storage devices. One type of laser is the vertical cavity surface emission laser (VCSEL). FIG. 1 illustrates a cutaway side view of a sample prior art VCSEL 10. The sample VCSEL 10 is a conventional oxide-confined top emitting VCSEL 10. The VCSEL 10 includes a top reflector 20 and a bottom reflector 30 sandwiching an active region 40. The reflectors 20 and 30 and the active region 40 are fabricated on a substrate 50. A bottom electrode 52 is connected to the substrate while a top electrode 54 is connected to the top reflector 20.

The substrate 50 may be n-type gallium arsenide (GaAs) doped with silicon. The bottom electrode 52 forms an ohmic contact to the substrate 50 and is typically made of electrically conductive metal such as Gold-Germanium(AuGe) alloy.

The active region 40 includes a light generation layer 42 which is typically constructed from one or more quantum wells of InGaAs (indium gallium arsenide), GaAs (gallium arsenide), AlGaAs (aluminum gallium arsenide), or InAlGaAs (indium aluminum gallium arsenide). The light generation layer 42 is separated from the top reflector 20 by a top spacer 44 and separated from the bottom reflector 30 by a bottom spacer 46. The light generation layer 42 is configured to generate light having a predetermined or known wavelength. The predetermined wavelength can vary widely, for example, within a range from approximately 650 nanometers (nm) to approximately 1,400 nanometers. The spacer layers 44 and 46 may be fabricated using, for example, AlGaAs.

The active region 40 is sandwiched between the top reflector 20 and the bottom reflector 30. The top reflector 20 and the bottom reflector 30 are distributed Bragg reflectors (DBR) including alternating quarter wavelength thick layers of materials having differing optical index of refraction such as, for example, AlAs, GaAs, or AlGaAs having differing ratios of Aluminum and Gallium. For this reason, the top and bottom reflectors 20 and 30 are also referred to as DBR mirrors 20 and 30.

Conventionally, each layer of the DBR mirrors 20 and 30 has a thickness that is one-fourth (1;4) wavelength of the light generated by the active region 40. For simplicity, only eight layers (four pairs of layers) are illustrated in FIG. 1 for each of the DBR mirrors 20 and 30. In actual implementations each of the DBR mirrors 20 and 30 may include many more layers such as twenty or thirty pairs of layers.

In order to create the optical gain required for a semiconductor laser to operate, the active region 40 is composed of a p-n junction and electrical current is injected into it. To facilitate the flow of electrical current through the VCSEL 10, the DBR mirrors 20 and 30 are doped with carefully designed profiles of n- or p-type dopants in order to both improve the bulk material conductivity and to minimize the voltage drop across the many heterobarriers formed at the interfaces between the alternating quarter-wave layers.

While the heat generated due to bulk resistance and heterobarrier voltage drop in the conducting DBR mirrors can be mitigated by careful design of the doping profile, the heat generated in the p-n junction of the active region is intrinsic to the operation of the device and can not be fully eliminated. Normally, one DBR mirror is doped n-type and the other doped p-type, forming the p-n junction and its associated heat dissipation in the active region 40. For example, the top DBR mirror 20 may include p-doped GaAs, AlAs, or AlGaAs layers while the bottom DBR mirror 30 include n-doped GaAs, AlAs, or AlGaAs layers. The n dopant may be silicon and the p dopant may be carbon.

In the present sample VCSEL 10, the layers of the top reflector 20 are doped as p-type semiconductors and the layers of the bottom reflector 30 are doped as n-type semiconductors. The substrate 50 is doped to create an n-type contact.

The VCSEL 10 of such structure and its operations are known in the art. To produce laser light (lasing effect), electric current is introduced to the VCSEL 10 via the electrodes 52 and 54. When the current flows through the active region 40, photons (light particles) are generated by the quantum wells of the light generation layer 42. With sufficient current through the active region 40, optical gain is created that coherently amplifies the light which reflects back and forth between the DBR mirrors 20 and 30. A portion of the light is transmitted through the DBR mirrors 20 and 30, and an opening 56 in the top electrical contact is typically employed to allow the transmitted light out of the device 10. This escaping light is indicated by arrow 58.

Current confinement barrier 60 is often used to direct the electrical current generally toward the middle of the active region 40. When used, the current confinement barrier 60 insulates all but a circular or polygon-shaped area (from a top perspective, not shown) having a diameter that is typically similar to or smaller than the contact opening width 57. Because most of the electrical current is directed toward a portion 43 of the light generation layer 42, most of the light is generated within this portion 43 referred to as the active portion 43 herein.

To generate more light from the VCSEL 10, more current is applied to the VSCEL 10. Increased current not only results in more light but also in more heat generated at the active region 40. The heat adversely impacts the VCSEL 10 limiting the amount of light that can be generated by the VSCEL 10.

Excess heat in a VCSEL has a number of adverse effects including wavelength shift, gain reduction, increased absorption, refractive index shift and associated optical loss and DBR mirror reflectivity changes, leakage current, thermal lensing, and reduced efficiency. Combination of these effects and their spatial variation ultimately limits the maximum power, maximum single-lateral-mode power, maximum modulation bandwidth, and maximum efficiency the VCSEL 10 can achieve. Further, all of these parameters are of commercial importance. For example, long-wavelength (1300 nm wavelength of emitted light) VCSELs could be commercially lucrative as light sources in optical communication links running at very high bit rates over metro-area link lengths of 10 kilometers (km) or more, but heat generation in the VCSELs makes it very challenging to simultaneously meet the modulation speed, optical power, and single-mode optical power requirements of such links.

FIG. 2 illustrates a lateral temperature distribution curve 70 along the active region 40 similar to results obtained by detailed finite element modeling. Here, layer interval 42$i$ represents and corresponds to the extent of the light generation layer 42 of the VCSEL 10 of FIG. 1 and active interval 43$i$ represents and corresponds to the extent of the active portion 43 of the light generation layer 42 where most of the photons are generated. As illustrated in FIG. 2, temperature is highest at the active interval 43*i* and the temperature drops off sharply at the edges of the active interval 43*i*. Temperature differential 72 between the temperature at the active interval 43*i* and the temperature outside the active interval 43*i* is relatively large. The lateral temperature distribution curve 70 suggests that heat is effectively trapped within the active portion 43 of the VCSEL 10 and is not effectively distributed or dissipated thereby exacerbating the heat problems of the VCSEL 10 of FIG. 1.

The heat is trapped within active portion 43 largely because of the normally conflicting requirements of high optical contrast, high electrical conductivity, and high thermal conductivity of the DBR mirrors 20 and 30. DBR mirrors are typically designed for high optical contrast and low electrical loss. Further, DBR mirrors normally have relatively poor thermal conductivity resulting in heat generated in active portion 43 being trapped and forming high peak temperatures as illustrated in curve 70 of FIG. 2. The high peak temperature not only exacerbates problems associated with overheating such as limited efficiency, but the narrow spatial distribution caused by the heat confinement exacerbates problems associated with the lateral heat distribution such as thermal lensing.

Accordingly, there remains a need for an improved laser with improved heat dissipation characteristics thus alleviating or eliminating the adverse effects that heat has on the light emitting device.

SUMMARY

The need is met by the present invention. In one embodiment of the present invention, a light generating device includes a light generation layer, a top reflector, a bottom reflector, and at least one high thermal conductivity (HTC) layer between. The HTC layer can be placed between the light generation layer and the bottom reflector, between the light generation layer and the top reflector, or both. The light generation layer is adapted to generate light having a first wavelength. Heat produced at the light generation layer is more efficiently dissipated due to the presence of the HTC layer.

In another embodiment of the present invention, a light generating device includes a light generation layer, a top reflector, and a high thermal conductivity (HTC) bottom reflector. The light generation layer is adapted to generate light having a known wavelength. Heat produced at the light generation layer is more efficiently dissipated due to the fact that the bottom reflector is a HTC reflector.

Other aspects and advantages of the present invention will become apparent from the following detailed description, taken in conjunction with the accompanying drawings, illustrating by way of example the principles of the invention.

DETAILED DESCRIPTION

Figure 1:
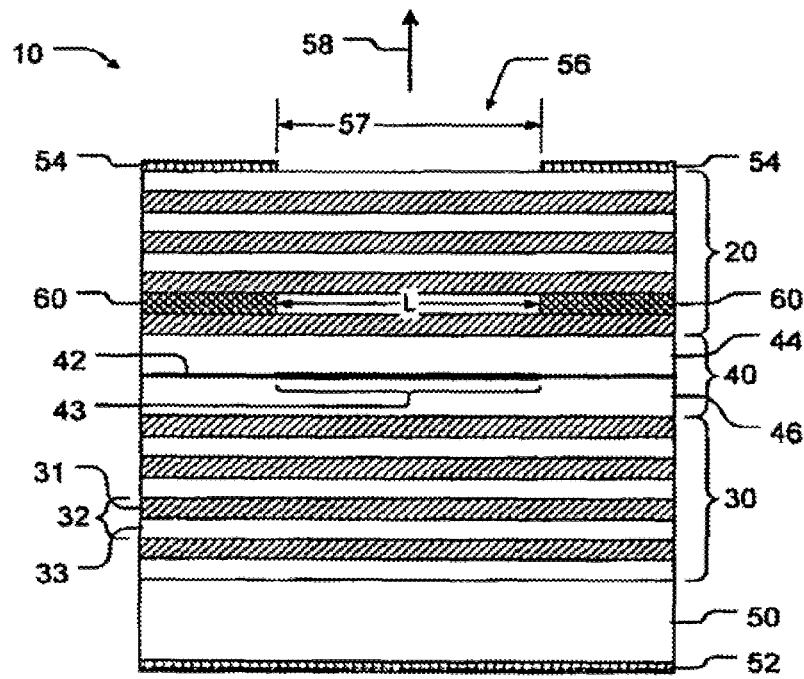
FIG. 1 illustrates a cutaway side view of a sample VCSEL of prior art.

The present invention will now be described with reference to the FIGS. 1 through 8C, which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "over" relative to other structures, portions, or both. As will be appreciated by those of skill in the art, relative terms and phrases such as "above" or "over" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "over" other structures or portions would now be oriented "below" or "under" the other structures or portions. Like numbers refer to like elements throughout.

As shown in the Figures for the purposes of illustration, embodiments of the present invention are exemplified by a light generating device having a light generation layer adapted to generate light having a known wavelength, a top reflector above the light generation layer, a bottom reflector below the light generation layer, and at least one high thermal conductivity (HTC) layer between. The HTC layer can be placed between the light generation layer and the bottom reflector, between the light generation layer and the top reflector, or both. Heat produced at the light generation layer is more efficiently dissipated due to the presence of the HTC layer. The HTC layer is made of material having relatively high thermal conductivity compared to the top and the bottom reflectors. With this design, the heat generated at the light generation layer is removed and dissipated more efficiently.

The present invention is based on, in part, the realization that placement of material having high thermal conductivity near the light generation layer would aid in heat dissipation. However, such material needs to meet a number of other requirements such as high optical transparency, an acceptable level of electrical conductivity, and ease of fabrication using known processes.

Referring again to FIG. 1, to achieve the desired reflectivity, the top and bottom reflectors 20 and 30 are typically constructed using pairs of layers, each pair having a first layer of a first composition of $Al_xGa_{(1-x)}As$ and a second layer of a second composition of $Al_xGa_{(1-x)}As$. The first layer and the second layer have indices of refraction different from each other. The thickness of each layer is one quarter of the wavelength of the generated light. The layers, together, form Bragg reflectors. The layers are typically constructed from paired layers of AlAs, GaAs, or varying compositions of AlGaAs.

The varying compositions of AlGaAs is often expressed in the following relationship:

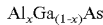

where X is a composition ratio of Aluminum and Gallium. For example, when X is zero, there is no Aluminum in the composition and the composition reduces to GaAs. When X is one (1), there is no Gallium in the composition, and the composition reduces to AlAs. When X is 0.3, for example, then the composition can be expressed as $Al_{(0.3)}Ga_{(0.7)}As$. In FIG. 1, the pairing of the layers is illustrated using a single pair 32 of layers within the bottom reflector 30. The pair 32 of layers includes a first layer 31 $Al_{(0.2)}Ga_{(0.8)}$ (having a composition ratio of 0.2) and a second layer 33 $Al_{(0.9)}Ga_{(0.1)}$ (having the composition ratio of 0.9).

Figure 3:
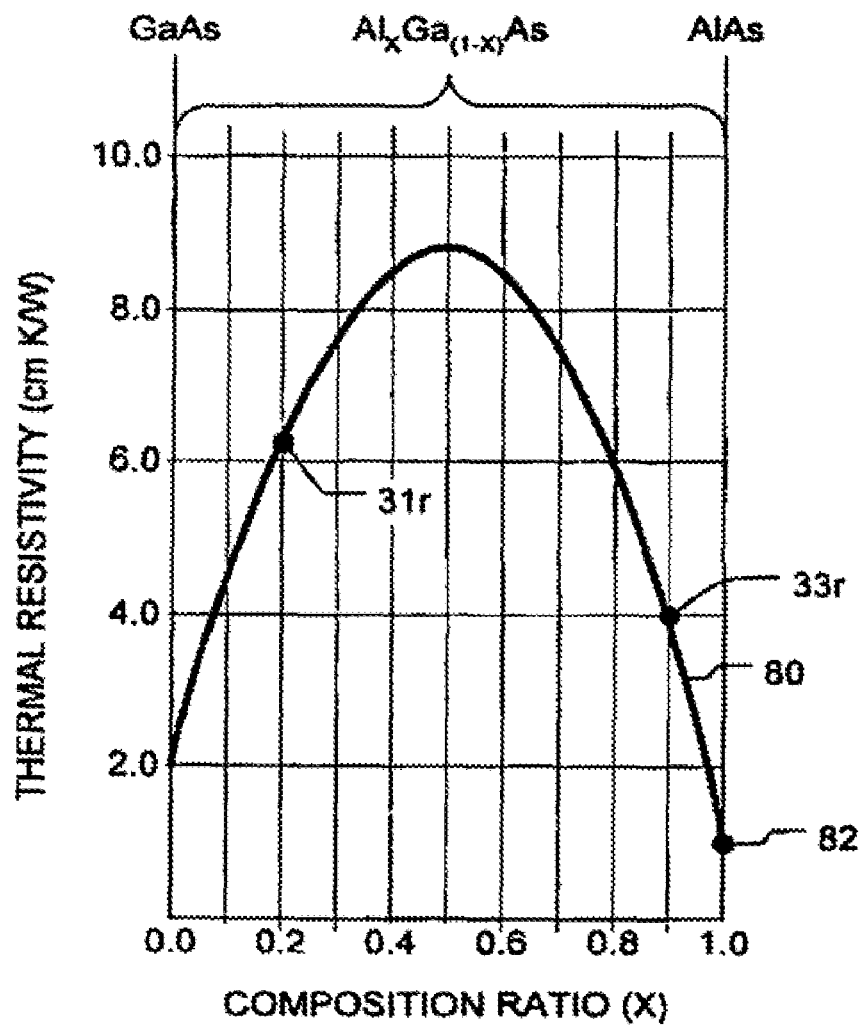
FIG. 3 illustrates a thermal resistivity curve representing approximate thermal resistivity of varying compositions of $Al_xGa_{(1-x)}As$.

Because of the differing ratio of Aluminum and Gallium, each of these layers has optical refractive index and thermal conductivity that is different than the other layer. FIG. 3 illustrates a thermal resistivity curve 80 representing approximate thermal resistivity of varying compositions of $Al_xGa_{(1-x)}As$. Thermal resistivity is inverse of thermal conductivity. In FIG. 3, horizontal axis (x-axis) represents the composition ratio of Aluminum (X) and vertical axis (y-axis) represents the thermal resistivity in centimeter-degrees Kelvin per Watt (cm*K/W). A one centimeter (cm) thick layer of material having a thermal resistivity of one cm*K/W would require a heat flow of one watt to sustain a one degree Kelvin temperature difference between the two sides.

Figure 2:
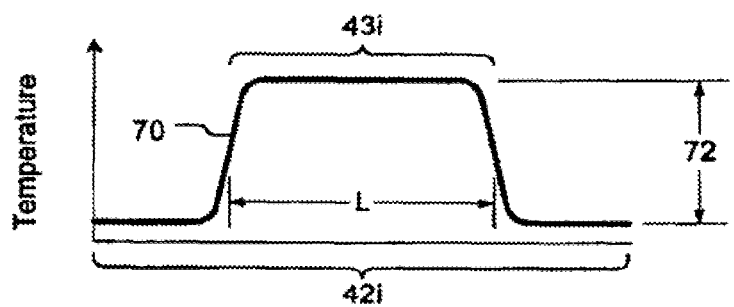
FIG. 2 illustrates a lateral temperature distribution curve along a portion of the VCSEL of FIG. 1.

Referring to FIGS. 1 and 2, as illustrated by the thermal resistivity curve 80, at composition ratio of 0.2, the first layer 31 $Al_{(0.2)}Ga_{(0.8)}As$ has an approximate thermal resistivity of a little over 6.0 cm K/W as indicated by reference numeral 31r. At composition ratio of 0.9, the second layer 33 $Al_{(0.9)}Ga_{(0.1)}As$ has an approximate thermal resistivity of a 4.0 cm K/W as indicated by reference numeral 33r.

As indicated by the thermal resistivity curve 80, for composition $Al_xGa_{(1-x)}As$, thermal resistance is lowest (hence, the thermal conductivity is highest) when the composition ratio X is equal to one (1). When the composition ratio X is one, the composition $Al_xGa_{(1-x)}As$ reduces to AlAs which has a relatively low thermal resistance (high thermal conductance) of approximately one cm K/W as illustrated by reference numeral 82 in FIG. 3. That is, AlAs has a relatively high thermal conductivity, acceptable level of optical clarity and electrical conductivity, and is relatively easy to fabricate using known processes. Accordingly, an AlAs layer can be used as a high thermal conductivity (HTC) layer near the light generation layer 40.

Figure 4:
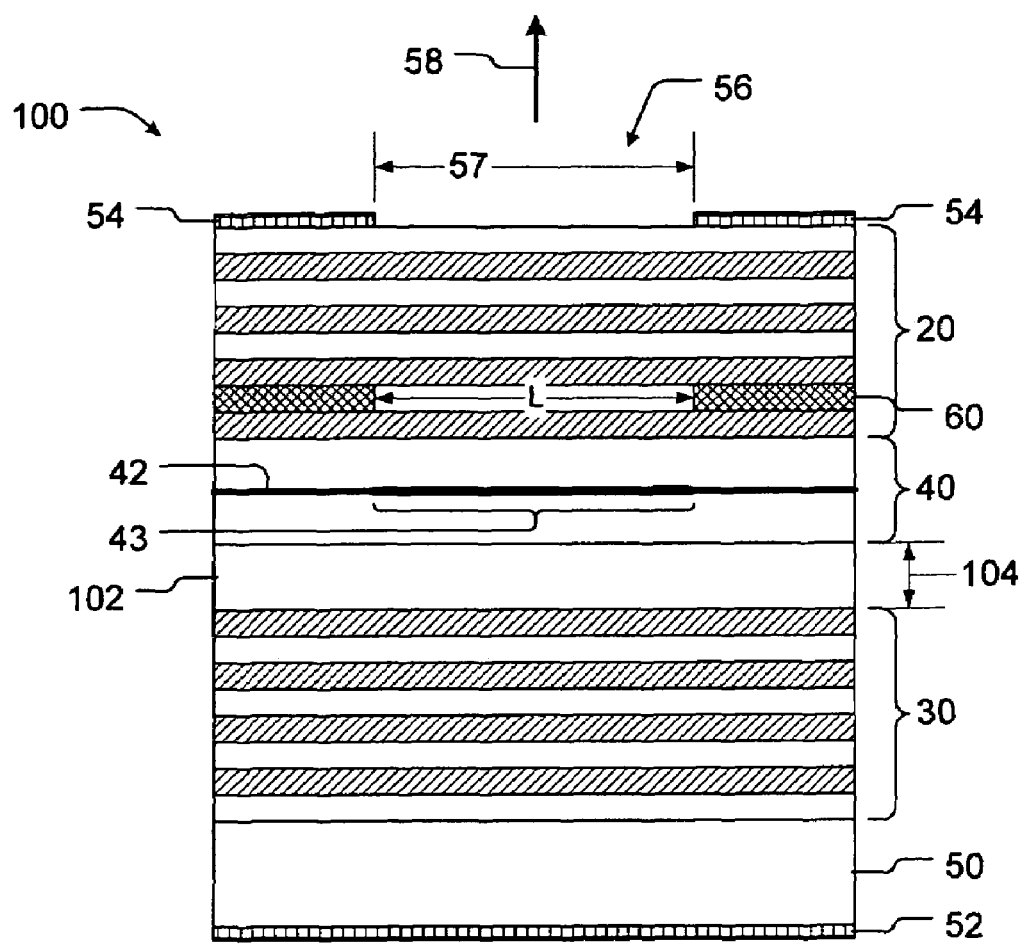
FIG. 4 illustrates one embodiment of a light generating device of the present invention.

FIG. 4 illustrates one embodiment of a light generating device 100 of the present invention such as a VCSEL 100. The VCSEL 100 of FIG. 4 includes many portions that are same as or similar to corresponding portions of the VCSEL 10 of FIG. 1. For convenience, portions of the VCSEL 100 of FIG. 4 that are same as or similar to corresponding portions of the VCSEL 10 of FIG. 1 are assigned the same reference numerals and different portions are assigned different reference numerals. Further, to avoid clutter, not all reference numerals illustrated for the VCSEL 10 of FIG. 1 are reproduced for the VCSEL 100 of FIG. 4 even though corresponding portions are illustrated in FIG. 1.

Referring to FIG. 4, the VCSEL 100 includes a light generation layer 40 adapted to generate light having a first, known wavelength. For example, the light generation layer 40 generates light have a wavelength of approximately 1.3 microns. The light generation layer 40 is sandwiched between a top reflector 20 above the light generation layer 40 and a bottom reflector 30 below the light generation layer 40. To facilitate dissipation of heat produced by the light generation layer 40, a high thermal conductivity (HTC) layer 102 is fabricated between the light generation layer 40 and one of the reflectors 20 or 30. In the illustrated embodiment, for example, the HTC layer 102 is placed between the light generation layer 40 and the bottom reflector 30. It is also understood that the HTC layer 102 can also be placed between the light generation layer 40 and the top reflector 20.

As with the VCSEL 10 of FIG. 1, the VCSEL 100 of FIG. 4 is fabricated over a substrate 50. Electrodes 52 and 54 connect, respectively, to the substrate 50 and the top reflector 20 to provide electrical contacts. The top reflector 20 and the bottom reflector 30 are distributed Bragg reflectors (DBR) formed by repeating alternating layers, or pairs of layers where each layer of the pair has a different refractive index compared to the other layer of the pair. Again, the top DBR mirror 20 is doped with p-type dopant and the bottom DBR mirror 30 is doped with n-type dopant in this embodiment.

The HTC layer 102 has a high optical transparency and has relatively higher thermal conductivity (or lower thermal resistance) compared to the thermal conductivity of the reflectors 20 and 30. Moreover, here, the HTC layer 102 is in thermal contact with the light generation layer 40 where most of the heat is directly generated. Therefore, the HTC layer 102 facilities the removal of and dissipation of heat from the light generation layer 40. Thickness 104 of the HTC layer 102 can range widely depending on application and is typically an integer multiple of one-half wavelength thick.

A half-wave layer behaves optically almost as if it weren't there at all. Accordingly, insertion of a half-wave HTC layer into a VCSEL structure adds the benefits of the HTC with little optical side effects. Half-wave layers have the further advantage in that their optical properties do not depend on whether the surrounding material has higher or lower refractive index. A quarter wave layer, such as is found in the DBRs, is optically reflective, and its behavior depends on the surrounding material. Quarter wave layers could be used for the HTC layer of the present invention, but the extra flexibility of the half-wave layer make it relatively more likely choice for the present invention at this time.

For example, for 1.3 micron wavelength, the HTC layer 102 can be as thin as 0.1 microns or as thick as several microns or more. Thicker HTC layers are more effective at heat removal, but also cause larger cavity mode volume, which can reduce the maximum modulation speed or efficiency of the VCSEL in some cases. Thus, the optimum thickness 104 of the HTC layer 102 would be determined by the detailed requirements of the particular VCSEL design and application. The HTC layer 102 can be fabricated using any suitable material. In the illustrated embodiment, the HTC layer 102 is fabricated using Aluminum Arsenide which has a relatively high thermal conductivity as discussed above and illustrated in relation to FIG. 3.

Figure 5:
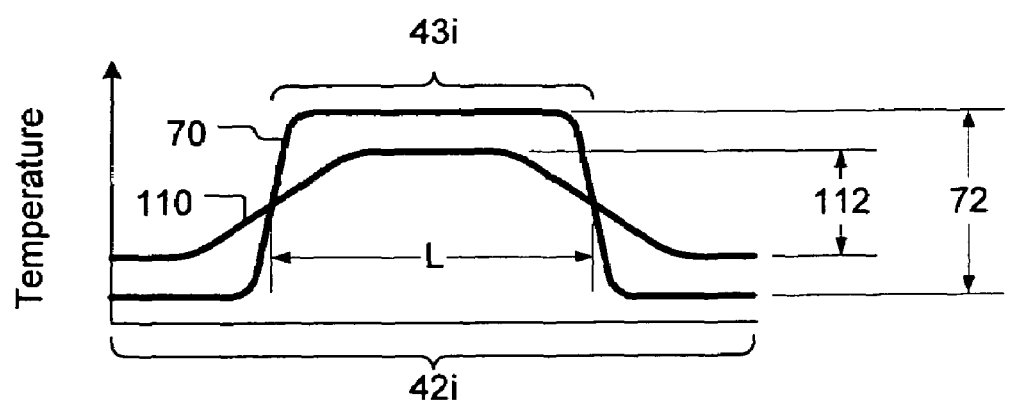
FIG. 5 illustrates a lateral temperature distribution curve along a portion of the VCSEL 100 of FIG. 4.

FIG. 5 illustrates a lateral temperature distribution curve 110 along the active region 40 of the VCSEL 100 of FIG. 4. Here, layer interval 42i represents and corresponds to the extent of the light generation layer 42 (of the VCSEL 100 of FIG. 4) and active interval 43i represents and corresponds to the extent of the active portion 43 of the light generation layer 42 (of the VCSEL 100 of FIG. 4) where most of the photons are generated.

The lateral temperature distribution curve 70 from FIG. 2 is reproduced in FIG. 5 for comparison with the lateral temperature distribution curve 110.

For the lateral temperature distribution curve 110, as expected, temperature is highest at the active interval 43*i* and the temperature drops off at the edges of the active interval 43*i*. However, the highest temperature shown by the temperature distribution curve 110 is lower than the highest temperature shown by the temperature distribution curve 70 thereby indicating that the active portion 43 of the VCSEL 100 of FIG. 4 runs cooler than the corresponding active portion 43 of the VCSEL 10 of FIG. 1.

Furthermore, temperature differential 112 (for curve 110) between the temperature at the active interval 43*i* and the temperature outside the active interval 43*i* is relatively smaller than the temperature differential 72 (for curve 70). Furthermore, the temperature transition from the active interval 43*i* to the temperature outside the active interval 43*i* is smoother for the curve 110 compared to the corresponding temperature drop off for the curve 70.

These observations suggest that, the HTC layer 102 of the VCSEL 100 aids in dissipation of heat generated within the light generation layer 40 allowing the VCSEL 100 (of FIG. 4) to operate cooler thereby alleviating or eliminating the problems associated with high temperatures and high temperature gradients within the light generation layer 40 of the VCSEL 10 (of FIG. 1).

In addition to the requirements for high reflectivity and optical transparency, the DBR mirror is preferably designed for low voltage drop so it generates little parasitic heat of its own during operation of the device. One method for improving the electrical conductivity of a DBR stack is by incorporating a spatially varying profile of dopants to encourage current flow. Another approach normally combined with the first is to insert a compositionally graded transition layer between each pair of alternating layers in the DBR mirror. The graded transition layer serves the function of spreading the bandgap change over a finite distance, which allows a carefully designed dopant profile to create a path of little electrical resistance. The graded layers are typically 100 to 300 angstroms thick. However, the graded composition transition layers are necessarily composed of material compositions between that of the alternating DBR layers. Referring to FIG. 3, if the DBR mirror is composed of alternating AlGaAs layers, then these graded transition layers contain a fraction of their thickness comprised of the AlGaAs compositions with the highest thermal resistivity. Thus, the graded layers contribute to the thermal resistance of the DBR mirror.

Figure 6:
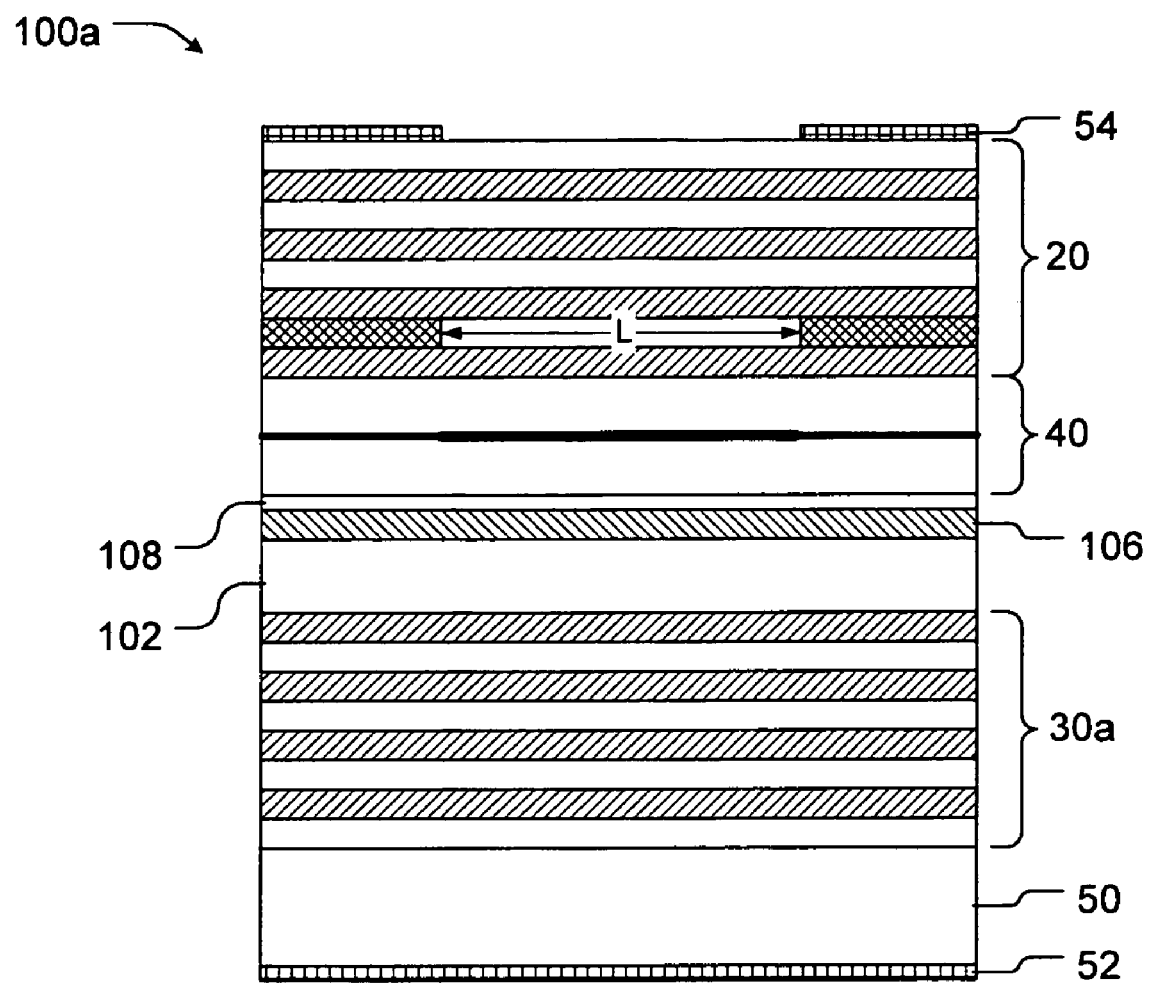
FIGS. 6, 7A, 7B, and 8A illustrate other embodiments of light generating device of the present invention.

FIG. 6 illustrates another embodiment of a light generating device 100*a* of the present invention such as a VCSEL 100*a*. The VCSEL 100*a* of FIG. 6 includes many portions that are same as or similar to corresponding portions of the VCSEL 100 of FIG. 4. For convenience, portions of the VCSEL 100*a* of FIG. 6 that are same as or similar to corresponding portions of the VCSEL 100 of FIG. 4 are assigned the same reference numerals, similar but changed portions are assigned the same reference numerals accompanied by letter "a," and different portions are assigned different reference numerals. Further, to avoid clutter, not all reference numerals illustrated for the VCSEL 100 of FIG. 4 are reproduced for the VCSEL 100*a* of FIG. 6 even though corresponding portions are illustrated in FIG. 4.

Referring to FIG. 6, the VCSEL 100*a* has essentially the same structure as the VCSEL 100 of FIG. 4 except for the following modifications: Firstly, the VCSEL 100*a* includes a non-doped bottom DBR mirror 30*a* while its top DBR mirror 20 is doped with a p-type dopant. Thus, the electrical current from the top electrode 54 flows downward through the p-doped DBR mirror 20 and the light generation layer 40, then laterally through a contact layer 106, and finally out the lower contact 52*a*.

The contact layer 106 can be fabricated using any material that can be rendered electrically conductive, optically transparent, and upon which a high quality light generation can be grown or deposited. Typical choices include GaAs, AlGaAs, InGaP, InGaAs, InP, AlInGaP or related materials or combinations of those materials. The contact layer can be made anywhere from, for example, 100 angstroms to several microns thick, though a typical heavily doped contact layer would be only several hundred angstroms thick to minimize optical losses and would typically be combined with a more lightly doped current spreading region of several thousand angstrom thickness comprising the total layer 106.

In some embodiments, the HTC layer 102 may also act as a current spreading layer to aid the lateral electrical conductivity of the contact layer. The lower n-type contact has been moved from the bottom of the structure up to the contact layer just below the active region in this implementation, to allow the lower DBR mirror to be undoped and ungraded. By eliminating the need for graded layers at the interfaces of the alternating DBR layers, the mirror itself can be made with much higher thermal conductivity. However, removing the graded layers would cause very high voltage drop at those interfaces and corresponding parasitic heat generation, so the electrical conduction path circumvents the DBR mirror such as provided by contact and spreading layers 106 and 102. Further, the substrate 50*a* need not be doped as the substrate 50 of FIG. 1.

The contact layer 106 may be separated from the light generation layer 40 using an etch-stop layer 108. The etch-stop layer 108 can be fabricated using many different materials such as InGaAs, InGaP, InP, AlInGaP or even GaAs or AlAs or related materials. The purpose of the etch stop layer is to add processing robustness for removing the upper layers 20 and 40 and stopping precisely on the contact layer 106. Accordingly, the etch stop layer is normally quite thin, typically only a few hundred angstroms in thickness. In some embodiments, the functions of layers 108, 106 and 102 may be combined into one or two layers.

Figure 7A:
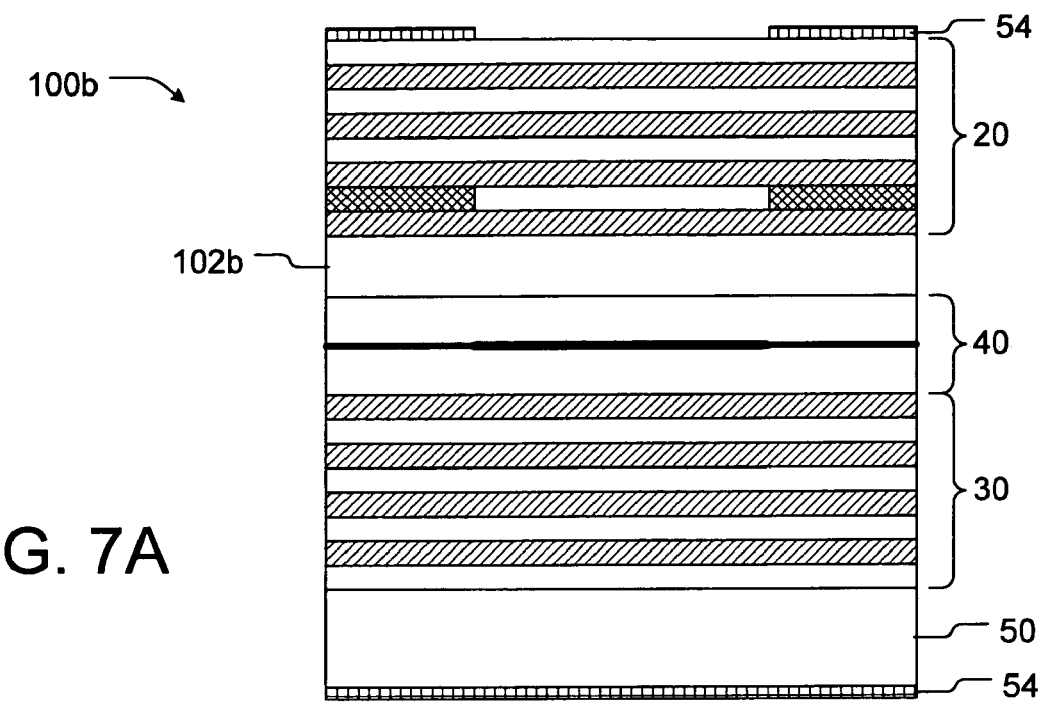

FIG. 7A illustrates another embodiment of a light generating device 100*b* of the present invention such as a VCSEL 100*b*. The VCSEL 100*b* of FIG. 7A includes many portions that are same as or similar to corresponding portions of the VCSEL 100 of FIG. 4. For convenience, portions of the VCSEL 100*b* of FIG. 7A that are same as or similar to corresponding portions of the VCSEL 100 of FIG. 4 are assigned the same reference numerals, similar but changed portions are assigned the same reference numerals accompanied by letter "b," and different portions are assigned different reference numerals. Further, to avoid clutter, not all reference numerals illustrated for the VCSEL 100 of FIG. 4 are reproduced for the VCSEL 100*b* of FIG. 7A even though corresponding portions are illustrated in FIG. 4.

Referring to FIG. 7A, the VCSEL 100*b* has essentially the same structure as the VCSEL 100 of FIG. 4 except that, in the VCSEL 100*b* its HTC layer 102*b* is positioned between the light generation layer 40 and the top DBR mirror 20. The HTC layer 102*b* is made of same or similar material and has similar configuration and structure as the HTC layer 102 of FIG. 4.

Figure 7B:
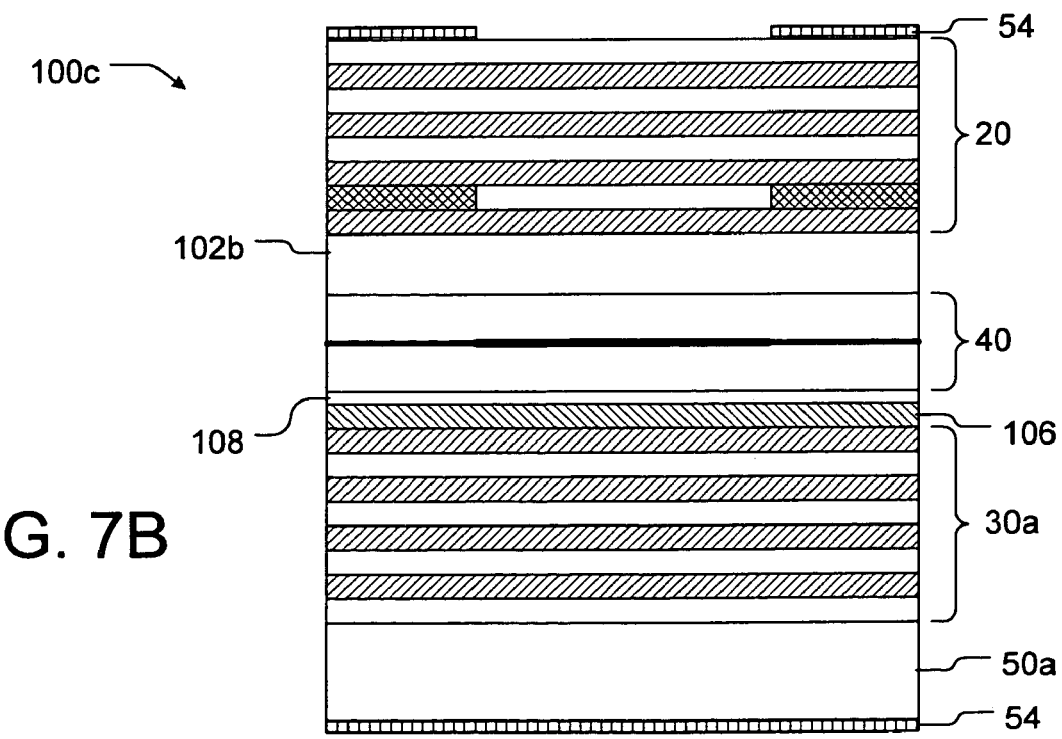

FIG. 7B illustrates another embodiment of a light generating device 100*c* of the present invention such as a VCSEL 100*c*. The VCSEL 100*c* of FIG. 7B includes many portions that are same as or similar to corresponding portions of the VCSEL 100a of FIG. 6 and the VCSEL 100b of FIG. 7A. For convenience, portions of the VCSEL 100b of FIG. 7A that are same as or similar to corresponding portions of the VCSEL 100a of FIG. 6 and/or the VCSEL 100b of FIG. 7A are assigned the same reference numerals, similar but changed portions are assigned the same reference numerals accompanied by letter "c," and different portions are assigned different reference numerals. Further, to avoid clutter, not all reference numerals illustrated for the VCSEL 100a of FIG. 6 and/or the VCSEL 100b of FIG. 7A are reproduced for the VCSEL 100c of FIG. 7B even though corresponding portions are illustrated in FIG. 6, FIG. 7A, or both.

Referring to FIG. 7B, the VCSEL 100c has essentially the same structure as the VCSEL 100b of FIG. 7A except for the following modifications: Firstly, the VCSEL 100c includes a non-doped bottom DBR mirror 30a while its top DBR mirror 20 is doped with a p-type dopant. Thus, the electrical current from the top electrode 54 flows through the p-doped DBR mirror 20, the HTC layer 102b, the light generation layer 40, and a contact layer 106 that is doped with n-type dopants. The contact layer 106 would be similar to the corresponding layer 106 in VCSEL 100a, and would have similar composition and thickness. The contact layer 106 is adapted to provide electronic contact between an electrode and the light generation layer 40.

The contact layer 106 is typically separated from the light generation layer 108 using an etch-stop layer 108. The etch-stop layer 108 has similar properties as the corresponding layer in VCSEL 100a of FIG. 6.

Figure 8A:
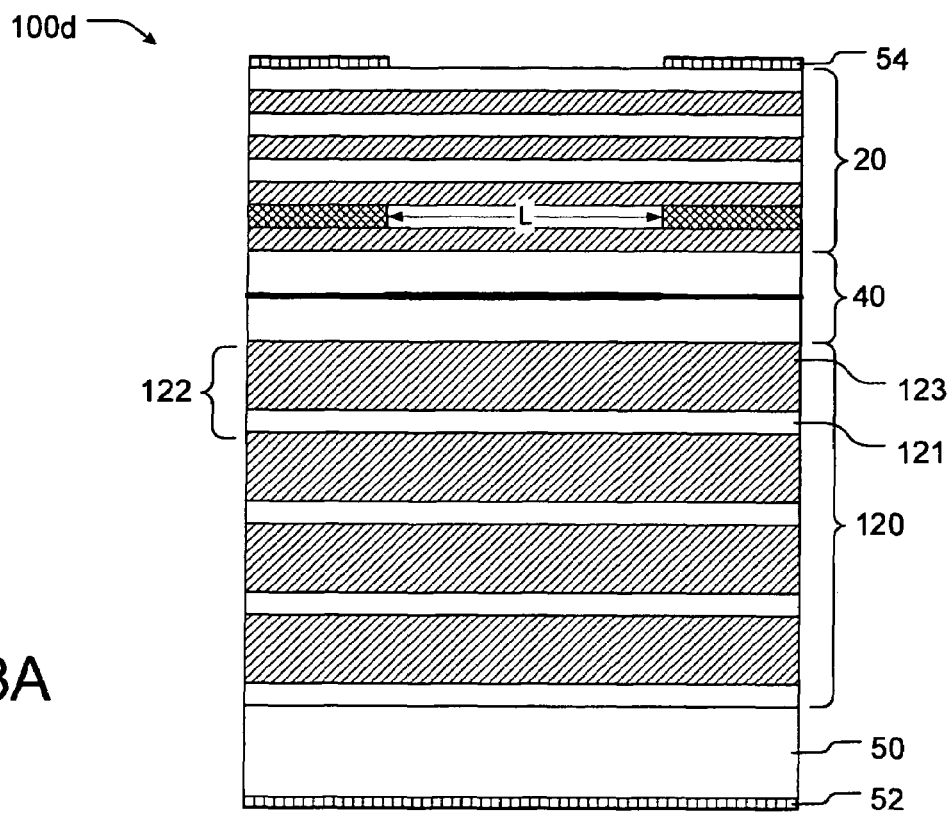

FIG. 8A illustrates another embodiment of a light generating device 100d of the present invention such as a VCSEL 100d. The VCSEL 100d of FIG. 8A includes many portions that are same as or similar to corresponding portions of the VCSEL 10 of FIG. 1. For convenience, portions of the VCSEL 100d of FIG. 8A that are same as or similar to corresponding portions of the VCSEL 10 of FIG. 1 are assigned the same reference numerals, similar but changed portions are assigned the same reference numerals accompanied by letter "d," and different portions are assigned different reference numerals. Further, to avoid clutter, not all reference numerals illustrated for the VCSEL 10 of FIG. 1 are reproduced for the VCSEL 100d of FIG. 8A even though corresponding portions are illustrated in FIG. 1.

Referring to FIG. 8A, the VCSEL 100d includes a light generation layer 40 adapted to generate light having a first known wavelength. For example, the light generation layer 40 generates light have a wavelength of approximately 1.3 microns. The light generation layer 40 is sandwiched between a top reflector 20 above the light generation layer 40 and a high thermal conductivity (HTC) bottom reflector 120 below the light generation layer 40.

As with the VCSEL 10 of FIG. 1, the VCSEL 100d of FIG. 8A is fabricated over a substrate 50. Electrodes 52 and 54 connect, respectively, to the substrate 50 and the top reflector 20 to provide electrical contacts. The top reflector 20 and the high thermal conductivity (HTC) bottom reflector 120 are distributed Bragg reflectors (DBR) formed by repeating alternating layers, or pairs of layers where each layer of the pair has a different refractive index compared to the other layer of the pair. Again, the top DBR mirror 20 is doped with p-type dopant and the bottom DBR mirror 30 is doped with n-type dopant in this embodiment.

The top reflector 20 of the VCSEL 100d of FIG. 8A is configured as the top reflector 20 of the VCSEL 10 of FIG. 1. However, the HTC bottom reflector 120 includes pairs of layers where each pair has a first layer having a first thermal conductivity and a first thickness and a second layer having a second thermal conductivity and having a second thickness. The HTC bottom reflector 120 includes, for example, a first pair 122 of layers.

The first pair 122 of layer includes a first layer 121 having a first thermal conductivity and a first thickness and a second layer 123 having a second thermal conductivity and a second thickness. Here, the first layer 121 can be, for example, $Al_{(0.2)}Ga_{(0.8)}As$ having a thermal resistivity of approximately a little over six cm K/W as discussed before. The first layer can have a thickness that is an odd multiple of quarter wavelength including being quarter wavelength thick (one times quarter wavelength). The second layer 123 can be, for example, $Al_{(0.9)}Ga_{(0.1)}As$ having a thermal resistivity of approximately four cm K/W as discussed before or even AlAs having thermal resistivity of approximately four cm K/W as illustrated in FIG. 3. The second layer can have a second thickness that is an odd multiple of quarter wavelength, for example, three times the quarter wavelength thick.

Here, the underlying concept for the design of the VCSEL 100d is to fabricate the HTC bottom reflector 120 such that it has a higher proportion of material having a relatively higher thermal conductivity (lower thermal resistivity) compared to material having a relatively lower thermal conductivity (higher thermal resistivity). The resulting HTC bottom reflector 120 has, as a whole, higher thermal conductivity (lower thermal resistivity) compared to the thermal conductivity of the bottom reflector 30 of FIG. 1.

The HTC bottom reflector 120 has uniform HTC layer pairs. That is, as illustrated in FIG. 8A, each pair of layers of the HTC bottom reflector 120 is similarly configured with a first layer of each pair being quarter wavelength thick with a second layer of each pair being a same odd multiple of quarter wavelength thick, for example three times the quarter wavelength thick.

Figure 8B:
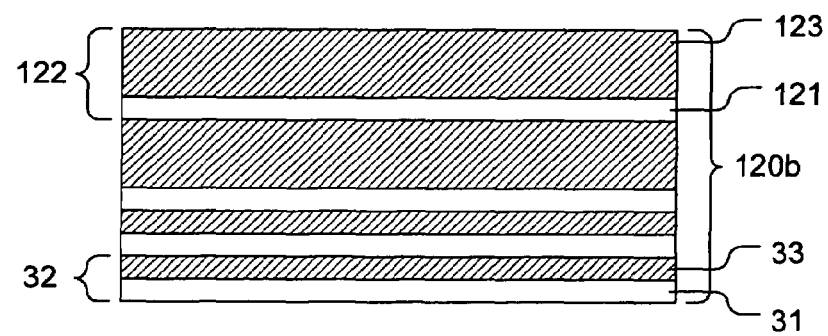
FIGS. 8B and 8C illustrate alternative embodiments of a portion of light generation device of FIG. 8A.
Figure 8C:
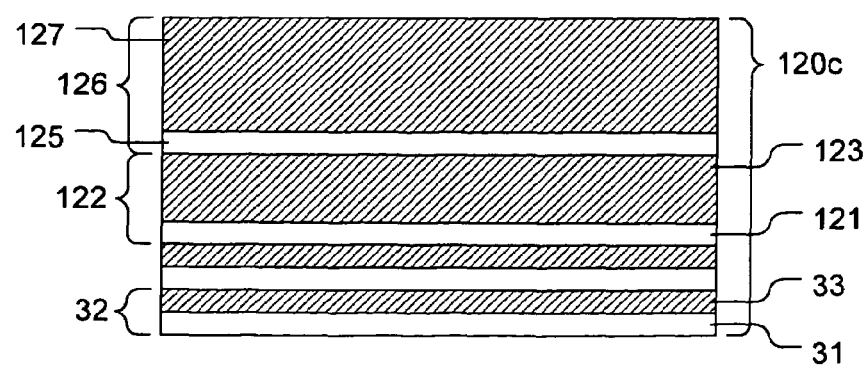

FIGS. 8B and 8C illustrate alternative embodiments of HTC bottom reflector 120 of FIG. 8A as HTC bottom reflectors 120b and 120c. In FIG. 8B, the HTC bottom reflector 120b includes non-uniform HTC layer pairs. That is, as illustrated in FIG. 8B, a first HTC layer pair 122 of layers of the HTC bottom reflector 120b is configured as the first pair 122 illustrated in FIG. 8A and described above. That is, the first pair 122 of layer includes a first layer 121 having a first thermal conductivity and a first thickness and a second layer 123 having a second thermal conductivity and a second thickness. Here, the first layer 121 can be, for example, $Al_{(0.2)}Ga_{(0.8)}As$ having a thermal resistivity of approximately a little over six cm K/W as discussed before. The first layer can have a thickness that is an odd multiple of quarter wavelength including being quarter wavelength thick (one times quarter wavelength). The second layer 123 can be, for example, $Al_{(0.9)}Ga_{(0.1)}As$ having a thermal resistivity of approximately four cm K/W as discussed before or even AlAs having thermal resistivity of approximately four cm K/W as illustrated in FIG. 3. The second layer can have a thickness that is an odd multiple of quarter wavelength, for example, three times the quarter wavelength thick.

The HTC bottom reflector 120b also includes a second HTC layer pair 32 of layers that is configured similar to the pair 32 of layers of VCSEL 10 of FIG. 1. The second pair 32 of layers includes a third layer 31 having the same thermal conductivity (first thermal conductivity) and the same thickness (first thickness) as the first layer 121. The second pair 32 of layers further includes a fourth layer 33 having the same thermal conductivity (second thermal conductivity) as the second layer 123 but having the same thickness (first thickness) as the first layer 121.

In FIG. 8C, the HTC bottom reflector 120c includes another configuration of non-uniform HTC layer pairs. Here, as illustrated in FIG. 8C, a first HTC layer pair 122 of layers of the HTC bottom reflector 120c is configured as the first pair 122 illustrated in FIG. 8A and described above. The HTC bottom reflector 120c also includes a second HTC layer pair 32 configured similar to the pair 32 of layers illustrated in FIG. 8B and described above. The HTC bottom reflector 120c further includes a third HTC layer pair 126 including a fifth layer 125 having the same thermal conductivity (first thermal conductivity) and the same thickness (first thickness) as the first layer 121. The third pair 126 of layers also includes a sixth layer 127 having the same thermal conductivity (second thermal conductivity) as the second layer 123 but having a third thickness that is an odd multiple of quarter wavelength, for example, five times the quarter wavelength thick.

Although the discussion has focused on electrically-pumped semiconductor vertical cavity lasers, the concept and benefits of the present invention are more broadly applicable to lasers and optical devices of other types. For example, optically pumped lasers normally generate heat in the light generating layer creating a temperature profile and heat flow very similar to that described for the electrically pumped VCSEL here, and would benefit from the same types of HTC layer configurations. A second example is a resonant cavity LED, an electrically pumped semiconductor device similar to a VCSEL described here, but which does not achieve a lasing state. However, the maximum output power of the resonant cavity LED is limited by heat generation much like a VCSEL, and the device would benefit in the same way from the same types of HTC layer configurations described here.

From the foregoing, it will be apparent that the present invention is novel and offers advantages over the current art. Although specific embodiments of the invention are described and illustrated above, the invention is not to be limited to the specific forms or arrangements of parts so described and illustrated. For example, the HTC reflector can be fabricated as the top reflector 20 instead of or in addition to the HTC bottom reflector 120. Furthermore, different materials can be used instead of or in addition to various compositions of AlGaAs but still fall within the scope of the present invention. The invention is limited by the claims that follow.

What is claimed is:

1. A vertical cavity surface emitting laser (VCSEL), comprising:
    a light generation layer configured to generate light having a known wavelength;
    a reflector;
    at least one high thermal conductivity (HTC) layer disposed between the light generation layer and the reflector, the HTC layer having a thickness defined by an integer multiple of one-half the known wavelength, the HTC layer in consequence being substantially optically transparent to the generated light and having optical properties independent of the refractive indices of other layers in contact therewith, the HTC layer having a thermal conductivity exceeding that of the reflector, the HTC layer further being configured to remove and dissipate heat generated by the light generation layer.

2. The VCSEL of claim 1 wherein said reflector is a distributed Bragg reflector (DBR).

3. The VCSEL of claim 1 wherein said at least one HTC layer comprises an element selected from a group consisting of Aluminum Arsenide, Gallium Arsenide, and Indium phosphide.

4. The VCSEL of claim 1 further comprising an electrode connected to said reflector.

5. The VCSEL of claim 1 further comprising a contact layer configured adapted to provide electronic contact between an electrode and said light generation layer.

6. The VCSEL of claim 5 further comprising an etch stop layer in connection with said contact layer.

7. The VCSEL of claim 1, wherein the thickness of the at least one HTC layer is one-half the known wavelength.

8. The VCSEL of claim 1, wherein the at least one HTC layer is further configured as a current spreading layer.

9. The VCSEL of claim 1, wherein the at least one HTC layer is incorporated into the reflector, the HTC layer and the reflector together forming an HTC reflector.

10. The VCSEL of claim 1, wherein at least one of an etch stop layer and a contact layer is disposed between the light generation layer and the at least one HTC layer.

* * * * *

UNITED STATES PATENT AND TRADEMARK OFFICE
CERTIFICATE OF CORRECTION

| | | |
|---|---|---|
| PATENT NO. | : 7,372,886 B2 | Page 1 of 1 |
| APPLICATION NO. | : 10/862753 | |
| DATED | : May 13, 2008 | |
| INVENTOR(S) | : Yoon K. Song et al. | |

It is certified that error appears in the above-identified patent and that said Letters Patent is hereby corrected as shown below:

Column 12, Line 24-25, (Approx.), Claim 3, delete "phospide" and insert -- phosphide --.

Signed and Sealed this

Second Day of November, 2010

David J. Kappos
*Director of the United States Patent and Trademark Office*